(12) United States Patent
BrightSky et al.

(10) Patent No.: US 11,647,683 B2
(45) Date of Patent: May 9, 2023

(54) PHASE CHANGE MEMORY CELL WITH A THERMAL BARRIER LAYER

(71) Applicant: INTERNATIONAL BUSINESS MACHINES CORPORATION, Armonk, NY (US)

(72) Inventors: Matthew Joseph BrightSky, Armonk, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/576,834

(22) Filed: Sep. 20, 2019

(65) Prior Publication Data

US 2021/0091307 A1    Mar. 25, 2021

(51) Int. Cl.
*H01L 29/66*    (2006.01)

(52) U.S. Cl.
CPC ......... *H10N 70/828* (2023.02); *H10N 70/011* (2023.02); *H10N 70/231* (2023.02); *H10N 70/826* (2023.02); *H10N 70/8413* (2023.02)

(58) Field of Classification Search
CPC ... H01L 45/1246; H01L 45/06; H01L 45/126; H01L 45/1233; H01L 45/16; H01L 21/8229; H01L 21/8239; H01L 27/222; H01L 27/24; H01L 29/685; H01L 29/792; H01L 29/8615; H01L 45/04; H01L 2027/11838; H01L 2924/13089; H01L 2924/14; H01L 27/2463; H01L 45/146; H01L 45/1675; H01L 45/144
See application file for complete search history.

(56) References Cited

U.S. PATENT DOCUMENTS

| | | | |
|---|---|---|---|
| 5,837,564 A * | 11/1998 | Sandhu | ............... H01L 45/1233 |
| | | | 438/95 |
| 7,391,050 B2 | 6/2008 | Happ | |
| 7,663,909 B2 | 2/2010 | Philipp | |
| 7,687,377 B2 | 3/2010 | Chen | |
| 7,956,358 B2 | 6/2011 | Chen | |
| 8,680,501 B2 | 3/2014 | Schrott | |
| 2007/0007613 A1 | 1/2007 | Wang | |
| 2011/0215288 A1 | 9/2011 | Matsui | |
| 2014/0117302 A1 | 5/2014 | Goswami | |

(Continued)

FOREIGN PATENT DOCUMENTS

KR          101463776 B1 * 11/2014   ........... C23C 16/305

*Primary Examiner* — Samuel Park
(74) *Attorney, Agent, or Firm* — Douglas M. Crockatt

(57) ABSTRACT

A method may include forming a bottom electrode in an interlayer dielectric, depositing a liner on top of the bottom electrode, depositing a phase change material layer on top of the liner, wherein a top surface of the liner is in direct contact with a bottom surface of the phase change material layer, and depositing a barrier on top of the phase change material layer, wherein a top surface of the phase change material layer is in direct contact with a bottom surface of the barrier. The barrier may be made of doped phase change material. The forming of the bottom electrode may further include forming a via in the interlayer dielectric, depositing an outer layer along a bottom and a sidewall of the via, depositing a middle layer on top of the outer layer, and depositing an inner layer on top of the middle layer.

20 Claims, 5 Drawing Sheets

(56) References Cited

U.S. PATENT DOCUMENTS

| | | | |
|---|---|---|---|
| 2016/0104840 A1* | 4/2016 | Cook | H01L 45/1233 257/4 |
| 2016/0163975 A1* | 6/2016 | Petz | H01L 45/16 257/4 |
| 2019/0044065 A1* | 2/2019 | Tseng | H01L 45/146 |
| 2020/0119270 A1* | 4/2020 | Petz | H01L 45/06 |

* cited by examiner

SECTION A-A

SECTION B-B

SECTION B-B

SECTION B-B

PHASE CHANGE MEMORY CELL WITH A THERMAL BARRIER LAYER

BACKGROUND

The present invention relates generally to a phase change memory cell, and more particularly, to a method and structure for forming a phase change memory cell with a thermal barrier layer.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

To facilitate a change from the crystalline phase to the amorphous phase, an electrical energy, such as a voltage pulse, may be applied to one of the electrodes, for example a bottom electrode, causing the phase change material at the electrode, or substantially in the vicinity thereof, to heat above its melting temperature. The phase change material is then rapidly cooled below its glass temperature. The phase change material that is treated in this way is transformed from the crystalline phase to the amorphous phase. An amorphized area is created in the phase change material where such a phase transition has occurred.

The size of the amorphized area corresponds to the molten area created by the melting of the phase change material, and is dependent on the magnitude of the applied voltage. Where the phase change memory cell is designed to have a relatively high resistive area, a larger voltage drop and a higher temperature will occur compared to other areas of the phase change memory cell, resulting in the creation of a so-called hotspot in the phase change material at such an area.

SUMMARY

According to one embodiment of the present invention, a method is provided. The method may include forming a bottom electrode in an interlayer dielectric, depositing a liner on top of the bottom electrode, depositing a phase change material layer on top of the liner, wherein a top surface of the liner is in direct contact with a bottom surface of the phase change material layer, and depositing a barrier on top of the phase change material layer, wherein a top surface of the phase change material layer is in direct contact with a bottom surface of the barrier. The barrier may be made of doped phase change material. The forming of the bottom electrode may further include forming a via in the interlayer dielectric, depositing an outer layer along a bottom and a sidewall of the via, depositing a middle layer on top of the outer layer, and depositing an inner layer on top of the middle layer. The middle layer may be more conductive than the outer layer and the inner layer. The method may also include depositing a top electrode on top of the barrier.

According to another embodiment of the present invention, a method is provided. The method may include forming a bottom electrode in an interlayer dielectric, removing a portion of the bottom electrode to expose a top surface of a wire, depositing a liner on top of the bottom electrode, depositing a phase change material layer on top of the liner, wherein a top surface of the liner is in direct contact with a bottom surface of the phase change material layer, and depositing a barrier on top of the phase change material layer, wherein a top surface of the phase change material layer is in direct contact with a bottom surface of the barrier.

According to another embodiment of the present invention, a structure is provided. The structure may include a bottom electrode, a phase change material layer on top of the bottom electrode, and a barrier on top of the phase change material, wherein the barrier separates the phase change material from a top electrode. The phase change material layer and the barrier may have different thermal conductivities. The bottom electrode may include an outer layer, a middle layer, wherein the middle layer is between the outer layer and an inner layer, and the inner layer, wherein the inner layer is surrounded by the middle layer. The outer layer may be less conductive than the middle layer. The middle layer may be more conductive than the inner layer. The structure may also include a liner separating the bottom electrode from the phase change material layer.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
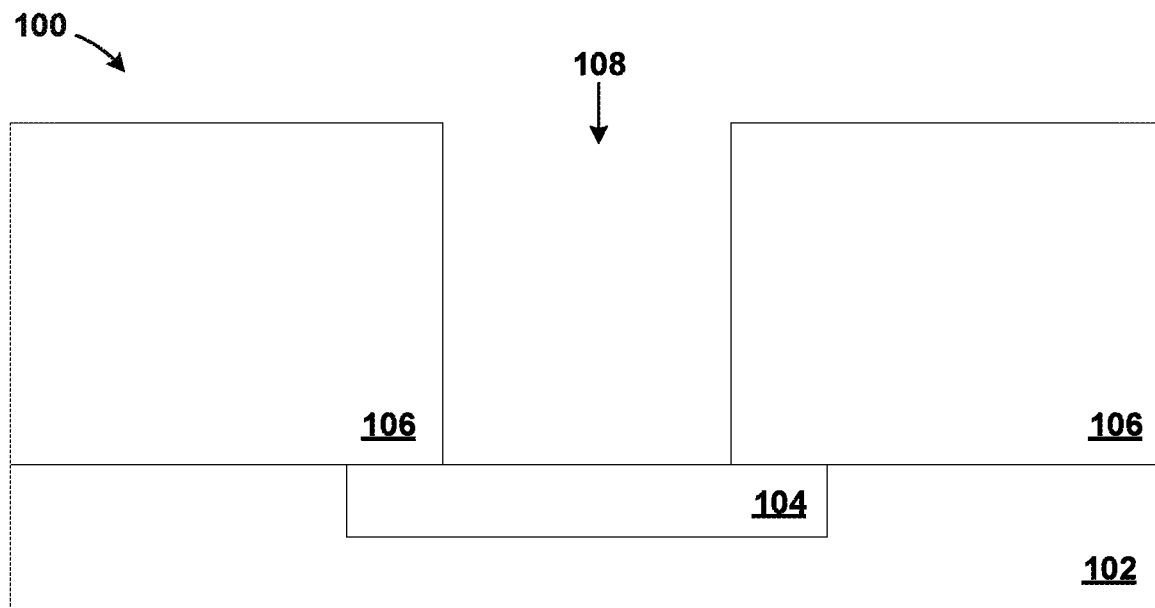
FIG. 1 is a cross section view illustrating forming a via in an interlayer dielectric according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a method and structure for forming a phase change memory cell with a thermal barrier layer. When the phase change memory cell is in use, the phase change material may be operated in one of at least two reversibly transformable phases, an amorphous phase and a crystalline phase. The amorphous state of the phase change material has high resistance and low conductance whereas the crystalline state of the phase change material has low resistance and high conductance. The amorphous and crystalline states may be used to program different data values within a phase change memory cell.

The programming of different data values within a phase change memory cell may be accomplished by using electrodes, such as, for example, a bottom electrode and a top electrode, to supply appropriate voltages to the phase change material. Depending on the applied voltage, the phase change material goes from either the crystalline state to the amorphous state, or vice versa. Further, a phase change material cell may have different programming levels. Each programming level may correspond with a different voltage that was applied to the phase change material to program it. Once the phase change material cell is programmed, a read voltage may be applied, using the electrodes, to retrieve information stored at that phase change material level.

However, once the phase change material cell is programmed, the resistance of the phase change memory may exhibit resistance drift. That is, the resistance of the programmed phase change material cell may increase over time. Therefore, it is advantageous to reduce the programming current necessary to program the phase change memory cell. This would allow for less voltage necessary to read or write the phase change memory cell.

Since the amount of programming current may be influenced by the volume of the phase change material, the lower the volume of the phase change material the better. Embodiments of the present invention provide a method of reducing the volume of the phase change material without compromising any attributes of the phase change memory cell by depositing a thermal barrier layer between the phase change material and the top electrode. In addition, the amount of programming current may be influenced by a cross sectional area of the electrode that may be in contact with the phase change material. As such, embodiments of the present invention provide a structure and a method of reducing the cross-sectional area of the electrode.

Referring now to FIG. 1, a structure 100 is shown, in accordance with an embodiment. The structure 100 may include a substrate 102, a wire 104, an interlayer dielectric (ILD) 106, and a via 108. The substrate 102 may be a silicon substrate with connections and structures, such as, for example, transistors and isolations built on it. The wire 104 may be made of any suitable material that allows for the wire 104 to connect transistors and other components to each other.

The ILD 106 may be deposited on top of the substrate 102 and the wire 104. The ILD 106 may be made of any suitable dielectric material, such as, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the ILD 106.

Once the ILD 106 is deposited, the ILD 106 may be patterned, using known techniques, to create the via 108. The patterning of the via 108 in the ILD 106 exposes the top surface of the wire 104. As a result, the via 108 may extend from the top of the ILD 106 to the bottom of the ILD 106. However, both the wire 104 and the substrate 102 are intact and are not affected by the ILD 106 patterning. The via 108 is patterned in the ILD 106 to a size that allows for the via 108 to be subsequently filled with a series of layers that make up a bottom electrode. In an embodiment of the invention, the number of vias 108 may correspond to the number of wires 104. For example, if there are four wires 104, there may be four vias 108 patterned in the ILD 106 above each of the wires 104.

Figure 2:
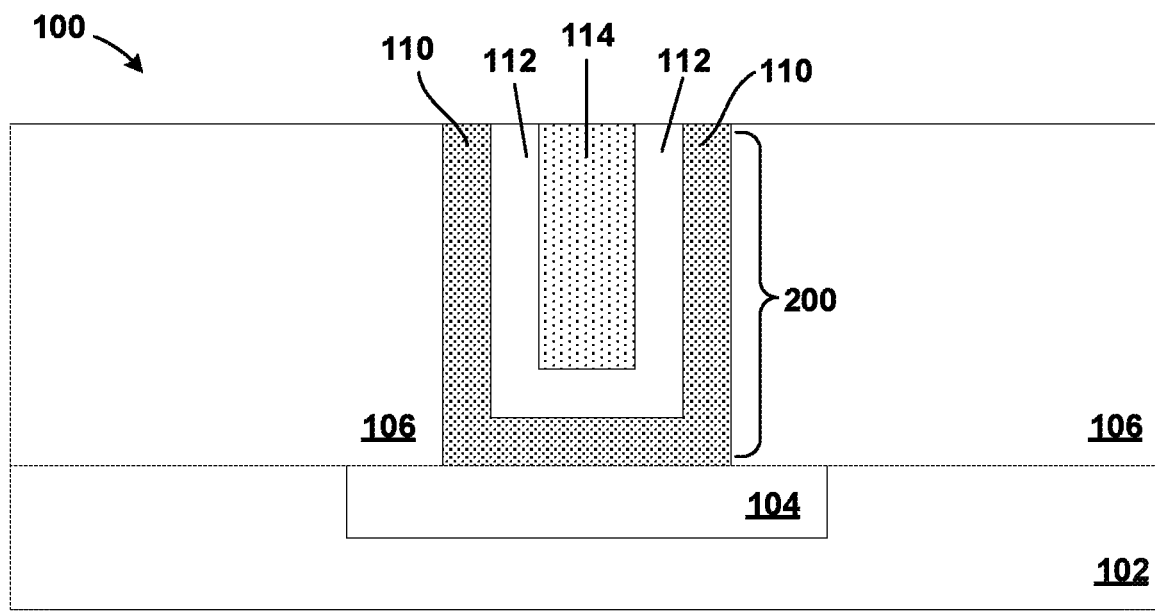
FIG. 2 is a cross section view illustrating forming of a bottom electrode in a dielectric layer according to an exemplary embodiment.

Referring now to FIG. 2, once the via 108 is patterned in the ILD 106, an outer layer 110 may be conformally deposited along the sidewalls and bottom of the via 108 using known techniques, such as, for example, an atomic layer deposition process. The outer layer 110 may be formed by any suitable material known in the art that has some conductive properties, such as, for example tantalum nitride, either alone or in combination with any other suitable conductive material. The outer layer 110 may be in direct contact with the top surface of the wire 104. As such, the outer layer 110 is conductive and functions as a barrier layer to prevent subsequent layers from migrating into the ILD 106. The outer layer 110 may be conformally deposited along the sidewalls and bottom of the via 108 to a thickness that prevents any additional layers deposited on top of the outer layer 110 from mitigating to the ILD 106.

Once the outer layer 110 is deposited, the atomic layer deposition process may also be used to conformally deposit a middle layer 112 on top of the outer layer 110, along the sidewalls and bottom of the via 108. The middle layer 112 may be made of conductive material such as titanium nitride or any other conductive material. The middle layer 112 may be made of material that is more conductive than the outer layer 110. For example, the outer layer 110 may be made of tantalum nitride and the middle layer 112 may be made of titanium nitride. Since titanium nitride is more conductive than tantalum nitride, the current may flow through the middle layer 112 to reach the phase change material.

Once the middle layer 112 is deposited, the atomic layer deposition process may be used again to conformally deposit an inner layer 114 on top of the middle layer 112 filling the remaining opening in the via 108. The inner layer 114 may be made of insulating material, such as, for example, silicon nitride. The outer layer 110, middle layer 112, and the inner layer 114 may be made of any combination of conductive and insulating materials suitable for the bottom electrode of a PCM cell. For example, in one embodiment, the outer layer 110 may be tantalum nitride, the middle layer 112 may be titanium nitride, and the inner layer 114 may be silicon nitride.

In an alternative embodiment, the outer layer 110 may be tantalum nitride and both the middle layer 112 and the inner layer 114 may be titanium nitride. In another alterative embodiment, all three layers 110, 112, and 114 may be made of the same material, such as, for example, tantalum nitride or titanium nitride. In yet another alternative embodiment, the outer layer 110 may be tantalum nitride, the middle layer 112 may be titanium nitride, and the inner layer 114 may be tantalum nitride. Even though there may be many combinations of material that may be used to form the three layers, it is advantageous that the outer layer 110 is made of material that is less conductive than the middle layer 112. This allows for the outer layer 110 to provide some thermal insulation during the programming of the phase change material. Further, when the outer layer 110 is less conductive than the middle layer 112, the outer layer 110 minimizes an effective diameter of the bottom electrode. The effective diameter of the bottom electrode should be big enough to allow for current to flow through to heat up the phase change material that is in direct contact or in substantial proximity to the middle layer 112. In addition, the inner layer 114 material may be completely insulating thus further allowing for the current to be contained within the middle layer 112. Having the current contained within the middle layer 112 allows for less current to be needed in order to heat the phase change material.

After the inner layer 114 is deposited on top of the middle layer 112, a chemical mechanical planarization (CMP) process may be used to remove excess portions of the outer layer 110, the middle layer 112, and the inner layer 114 remaining on top surfaces of the structure 100. The CMP process is stopped after all the outer layer 110, the middle layer 112, and the inner layer 114 is removed from the top surface of the ILD 106. The resulting structure 100, as illustrated in FIG. 2, may have the ILD 106 substantially flush with upper surfaces of the outer layer 110, the middle layer 112, and the inner layer 114. The outer layer 110, the middle layer 112, and the inner layer 114 may collectively make up a bottom electrode 130.

Figure 3:
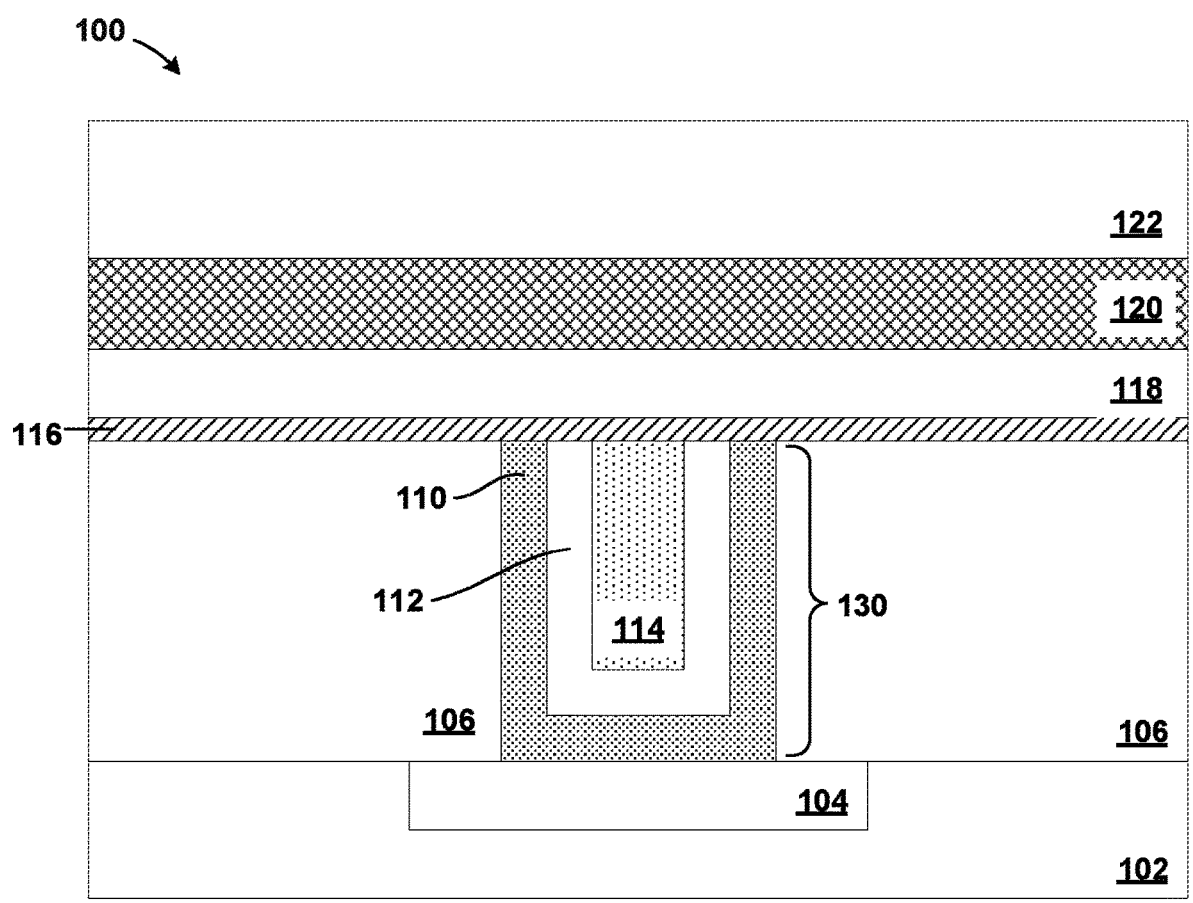
FIG. 3 is a cross section view illustrating depositing of a liner, a phase change material, a phase change material barrier, and a top electrode according to an exemplary embodiment.

Referring now to FIG. 3, the structure 100 is shown after additional layers are deposited, in situ, onto the top portion of the structure 100. The additional layers may include a liner 116, a phase change material layer 118, a barrier 120, and a top electrode 122 each deposited one on top of the other in order. The liner 116, the phase change material layer 118, the barrier 120, and the top electrode 122 are deposited in situ, without introducing oxygen, so that oxidation interfaces along each layer do not occur.

The liner 116 is first deposited onto the top portion of the structure 100. The liner 116 is made of conductive material such as, TaN, TiN, TiAlN, TiSiN, TaAlN, TaSiN, TiTaN, C, SiC, SiCN, or WN. Typically, when the phase change material is in the amorphous state, the phase change material is at a high resistance (in a low conductance state). When the phase change material is in the crystalline state, the phase change material is at a low resistance (in a high conductance state). When amorphous material is covering the bottom electrode, read current is passes through the bottom electrode and flows through the liner 116, bypassing the amorphous material, to reach the crystalline phase change material. The liner 116 provides the read current a shunt path. Instead of the current flowing directly to the top of the bottom electrode and to the surrounding phase change material, which is in the amorphous state, the current flows to the liner 116. Once in the liner 116, the current is directed around the amorphous state of the phase change material to reach portions of the phase change material in the crystalline phase. The liner 116 minimizes current from passing through the amorphous region of the phase change material thus preventing the current from picking up the resistance drift caused by the amorphous region.

The phase change material layer 118 is deposited on the liner 116 such that a bottom surface of the phase change material layer 118 is in direct contact with the top surface of the liner 116. The phase change material layer 118 may be formed from a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb). It is to be appreciated that the preceding list is merely illustrative and, thus, other elements can also be used to form the phase change material, while maintaining the spirit of the present principles. In an embodiment, the phase change material may be made of a chalcogenide alloy such as germanium-antimony-tellurium (GST), or antimony-tellurium (Sb—Te), or antimony (Sb) or germanium-tellurium (Ge—Te).

The phase change material layer 118 may also be made of a transition metal oxide having multiple resistance states. For example, the phase change material layer 118 may be made of at least one material selected from the group consisting of NiO, TiO2, HfO, Nb2O5, ZnO, WO3, and CoO or GST (Ge2Sb2Te5) or PCMO (PrxCa1-xMnO3). In an embodiment, the phase change material layer 118 may be a chemical compound including one or more elements selected from the group consisting of sulfur (S), selenium (Se), tellurium (Te), arsenic (As), antimony (Sb), germanium (Ge), tin (Sn), indium (In), and silver (Ag).

The barrier 120 is deposited on the phase change material layer 118 such that a bottom surface of the barrier 120 is in direct contact with the top surface of the phase change material layer 118. The barrier 120 may be made of material that has low thermal conductivity such as, for example, a phase change material that is doped with dopants. Some examples of dopants may include, but are not limited to, silicon dioxide, silicon carbide, carbon, or nitrogen. The barrier 120 may also be made of carbon alone or carbon with Si and/or N dopant. The barrier 120 acts as a thermal layer preventing heat within the phase change material layer 118 to dissipate to the top electrode 122. The barrier 120 may be any thickness. However, it is critical that the barrier 120 have a thickness that thermally insulates the top electrode 122 from the phase change material layer 118. For example, the barrier 120 may have a thickness in the range of 5 nm to 50 nm. The barrier 120 also needs to be electrically conductive enough (below 10 kohm) so as not to add a significant series resistance to the cell.

Further, by adding the barrier 120 between the phase change material layer 118 and the top electrode 122, the volume of the phase change material layer 118 may be reduced. For example, without the barrier 120, the phase change material layer 118 should be thick enough so that the current required to heat the phase change material does not dissipate into the top electrode 122. Without the barrier 120, the phase change material layer 118 functions as its own insulator. Therefore, the phase change material layer 118 has to be thick enough to limit the conduction of heat from the phase change material layer 118 to the top electrode 122 in order for the phase change material layer 118 to properly heat and change phases. As described herein above, the thicker the phase change material layer 118, the higher the current needed to heat the phase change material. Reducing the thickness of the phase change material layer 118 without having the barrier 120 allows for the top electrode to absorb most of the heat. In order to compensate for the heat loss, more current would need to be applied. However, since barrier 120 is a thermal barrier layer, the barrier 120 contains the heat within the phase change material layer 118 and prevents the heat from dissipating to the top electrode 122. As a result, the thickness of the phase change material layer 118 may be reduced thereby reducing the operating current (i.e. current required to change phases). Since the barrier 120 limits heat transfer from the phase change material layer 118 to the top electrode 122, a thinner phase change material (118) can be used thereby reducing the current (and power) needed to program the phase change memory cell.

With continued reference to FIG. 3, the top electrode 122 is deposited onto the top portion of the barrier 120. The top electrode 122 may also be referred to as a second electrode. The top electrode 122 may be formed of a conductive material, such as, for example, copper, tungsten, cobalt, aluminum, W, Ti, TiN, TaN to allow for current to pass through the top electrode 122.

As described herein above, the deposition of the barrier 120 between the phase change material layer 118 and the top electrode 122 allows for the phase change material layer 118 to be thinner. In addition, since the top electrode 122 may have a higher conductivity than the phase change material layer 118, the barrier 120 prevents the heat from escaping the thinner phase change material layer 118 to the top electrode 122. Rather, the heat is contained within the thinner phase change material layer 118. As a result, less current is needed to heat the phase change material.

Figure 4:
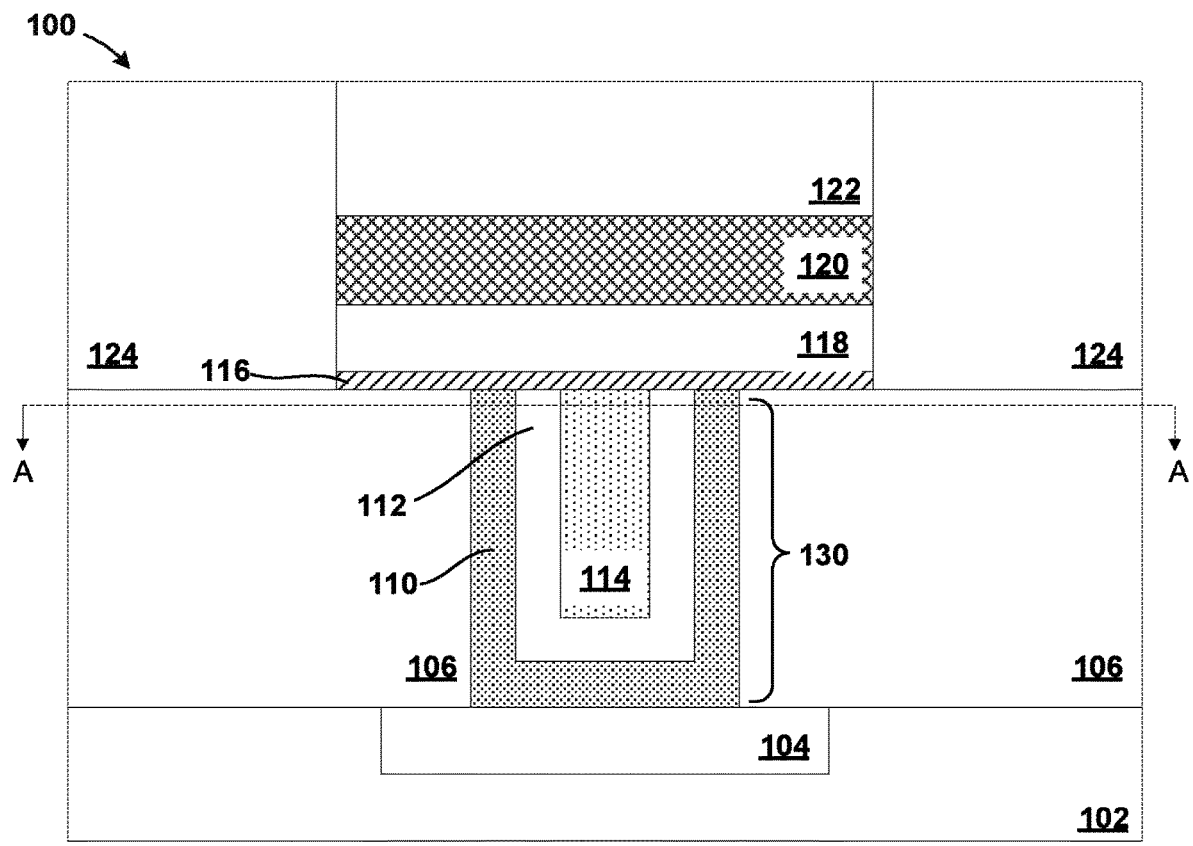
FIG. 4 is a cross section view illustrating a phase change memory cell according to an exemplary embodiment.

Referring now to FIG. 4, the structure 100 is shown with a second interlayer dielectric 124. Once the liner 116, the phase change material layer 118, the barrier 120, and the top electrode 122 are deposited in situ, the structure 100 may be patterned such that the layers 116, 118, 120, and 122 only remain on top of the top portions of the outer layer 110, the middle layer 112, and the inner layer 114. The remaining patterned area is then backfilled with the second interlayer dielectric 124. The final structure 100 is illustrated in FIG. 4.

In an alternative embodiment, instead of the liner 116, the phase change material layer 118, the barrier 120, and the top electrode 122 being deposited in situ and then patterned, the second interlayer dielectric 124 is deposited first. The second interlayer dielectric 124 is deposited onto the top portions of the ILD 106 and the top portions of the outer layer 110, middle layer 112, and the inner layer 114. The second interlayer dielectric 124 may then be patterned to form a second via (not shown in Figures). The second via may then be lined, in situ, with the liner 116, the phase change material layer 118, the barrier 120, and the top electrode 122 resulting in the final structure 100 as illustrated in FIG. 4.

Figure 5:
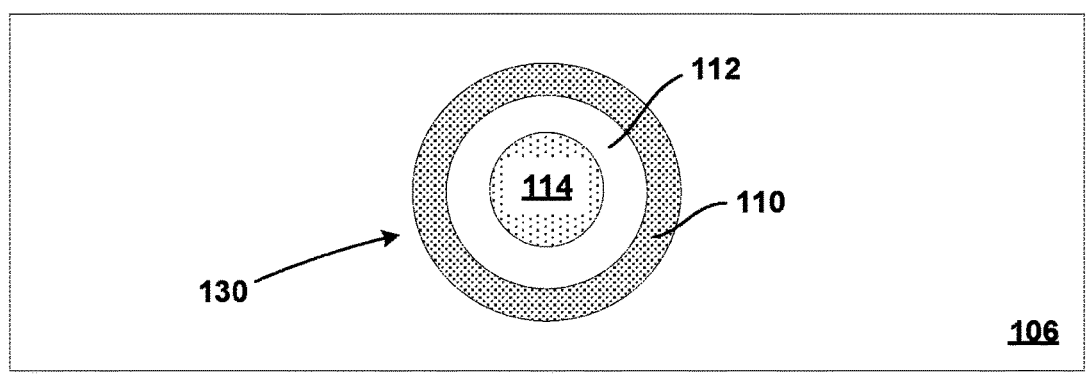
FIG. 5 is a cross section view illustrating Section A-A of FIG. 4 according to an exemplary embodiment.

Referring now to FIG. 5, a cross section view A-A of FIG. 4 is illustrated. As described herein, the outer layer 110, the middle layer 112, and the inner layer 114 may collectively be referred to as the bottom electrode. As illustrated in FIG. 5, the bottom electrode may be cylindrical in shape. The bottom electrode may have a large effective electrode width that spans from one outer edge of the middle layer 112 to the other outer edge of the middle layer 112, crossing the inner layer 114.

Figure 6:
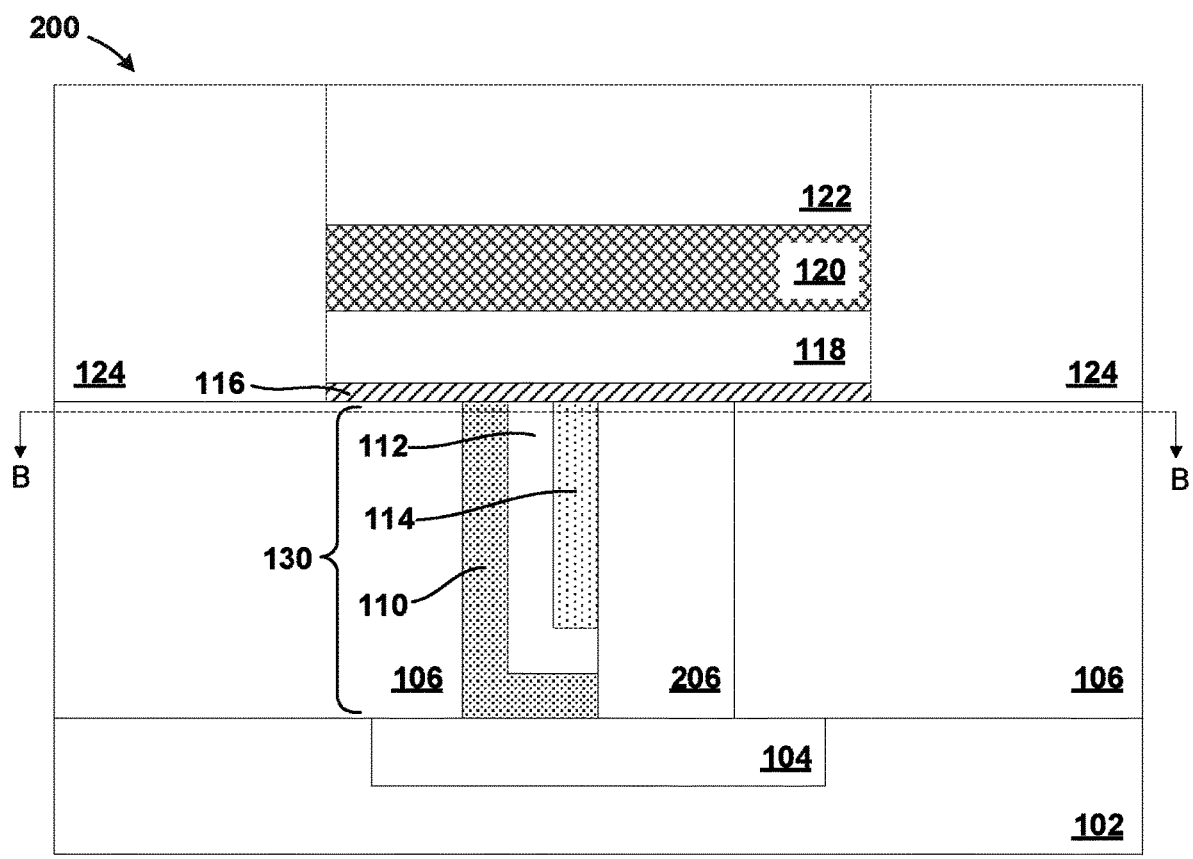
FIG. 6 is a cross section view illustrating a phase change memory cell according to an exemplary embodiment.

Referring now to FIG. 6, a structure 200 is shown according on an alternative embodiment of the invention. The structure 200 may be substantially similar in all respects to structure 100 illustrated in FIG. 4 and described in detail above; however, in the present embodiment, the cross-sectional area of the outer layer 110, the middle layer 112, and the inner layer 114 is reduced by a half from the cross-sectional area of the layers 110, 112, and 114 in the structure illustrated in FIG. 4.

As described herein above, in an embodiment of the invention, adding the barrier 120 between the phase change material layer 118 and the top electrode 122 allows for the thickness of the phase change material layer 118 to be reduced thus reducing the amount of current needed to heat the phase change material. In an alternative embodiment, reducing the cross section of the bottom electrode 130 (that is, reducing the cross-section area of the middle layer 112 in FIG. 5) may also reduce the amount of current needed to program the phase change material. With the reduction of the current that is needed to program the phase change material, the range of achievable resistances that are available increase. In addition, as described herein above, the read current may still flow through the liner, which provides the current a shunt path around the amorphous state of the phase change material. As a result, the current may reach portions of the phase change material in the crystalline phase.

Beginning with the structure 100 of FIG. 2, the ILD 106 may be substantially flush with upper surfaces of the outer layer 110, the middle layer 112, and the inner layer 114. The outer layer 110, the middle layer 112, and the inner layer 114 collectively make up the bottom electrode 130. A portion of the bottom electrode 130 may be masked and the other portion of the bottom electrode 130 may be etched to remove the portions of the outer layer 110, the middle layer 112, and the inner layer 114 that are not protected by the masking material. For example, about half (50%) of the bottom electrode 130 can be removed selective to the ILD 106. As a result, only about a half of the outer layer 110, the middle layer 112, and the inner layer 114 remain.

Etching the unmasked portion of the bottom electrode 130 creates another via opening (not illustrated in the FIGURES). The newly created via opening extends from the top portion of the ILD 106 to the bottom portion of the ILD 106, exposing a top portion of the wire 104. The new via opening is then backfilled with a third interlayer dielectric 206. Once the third interlayer dielectric 206 is deposited, the liner 116, the phase change material layer 118, the barrier 120, and the top electrode 122 may then be deposited, in situ, as described herein above with reference to FIG. 3.

Figure 7:
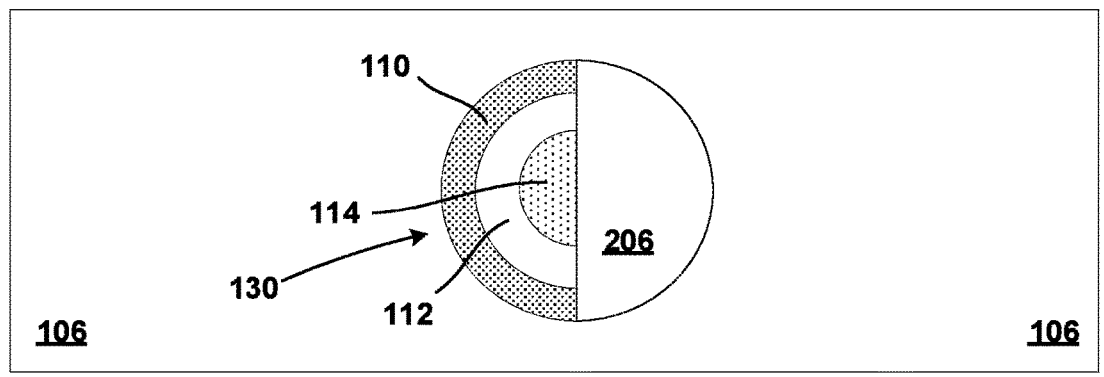
FIG. 7 is a cross section view illustrating Section B-B of FIG. 6 according to an exemplary embodiment.
Figure 8:
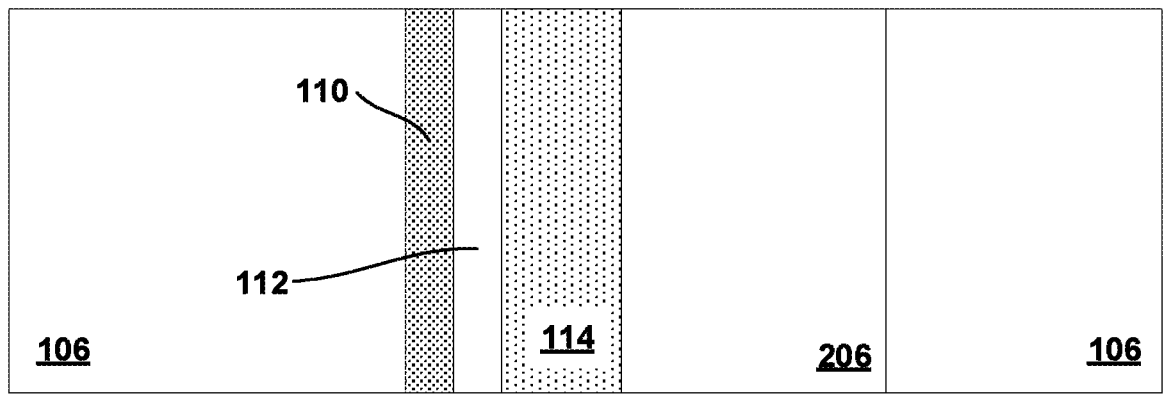
FIG. 8 is a cross section view illustrating an alternative Section B-B of FIG. 6 according to an exemplary embodiment.
Figure 9:
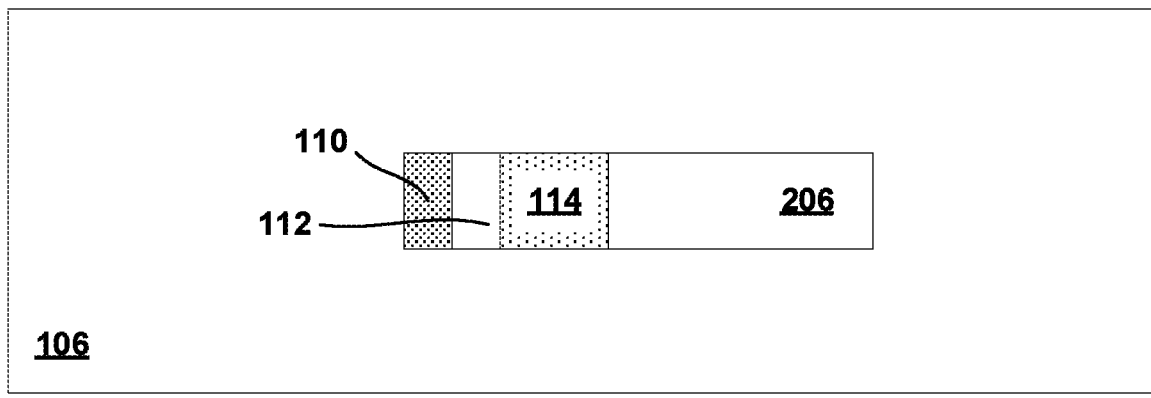
FIG. 9 is a cross section view illustrating an alternative Section B-B of FIG. 6 according to an exemplary embodiment.

Referring now to FIGS. 7-9, alternative cross section views B-B of FIG. 6 are illustrated where only a portion of the outer layer 110, a portion of the middle layer 112, and a portion of the inner layer 114 remain. In addition, as described herein above, the third interlayer dielectric 206 is used to backfill the new via opening that was created when portions of the outer layer 110, the middle layer 112, and the inner layer 114 were etched. Having alternative configurations of the bottom electrode 130, and more particularly the middle layer 112, is advantageous in creating a larger range of resistance states. The resistance may be controlled by the configuration of the middle layer 112. To further clarify, by minimizing the extent of the electrically conductive portion (the middle layer 112) of the bottom electrode, the distance from the electrically conductive portion of the middle layer 112 and the edge of the phase change material is maximized, thereby providing a larger range of regions over which the programmed amorphous portion of the phase change material can extend.

Referring now to FIG. 7, the resultant structure 200 of FIG. 6 has the cylindrical electrode that is about half the size of the bottom electrode of structure 100 illustrated in FIG. 4. In addition, the effective electrode width is the thickness of the sidewall of the middle layer 112. For example, the thickness of the sidewall of the middle layer 112 may be between 1 nm to 5 nm thick. This reduces the cross-section area of the bottom electrode in contact with the liner 116, which in turn allows for the programming current to be reduced.

Referring now to FIG. 8 the outer layer 110, the middle layer 112, and the inner layer 114 extending to the full sides of the liner 116. Referring now to FIG. 9, the outer layer 110, the middle layer 112, and the inner layer 114 that are smaller than the extent of the liner 116. The middle layer 112, illustrated in FIGS. 8 and 9, is a portion of the middle layer 112 illustrated in FIG. 4.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    a bottom electrode;
    a phase change material layer on top of the bottom electrode;
    a liner between and in direct contact with the bottom electrode and the phase change material layer, wherein the liner is configured to provide a current shunt path around an amorphous portion of the phase change material layer to a crystalline portion of the phase change material layer; and
    a barrier on top of the phase change material layer, wherein the barrier directly contacts and separates the phase change material layer from a top electrode, wherein the barrier is made of a phase change material that is doped with one or more dopants and that differs from a material from which the liner is formed.

2. The structure of claim 1, wherein the bottom electrode comprises:
    an outer layer;
    a middle layer, wherein the middle layer is between the outer layer and an inner layer; and
    the inner layer, wherein the inner layer is surrounded by the middle layer.

3. The structure of claim 2, wherein the outer layer is less conductive than the middle layer.

4. The structure of claim 2, wherein the middle layer is more conductive than the inner layer.

5. The structure of claim 1, wherein the liner separates the bottom electrode from the phase change material layer.

6. The structure of claim 1, wherein the phase change material layer and the barrier have different thermal conductivities.

7. The structure of claim 1, wherein the phase change material is a mixture of a mixture of gallium, antimony, and at least one material selected from the group consisting of tellurium, silicon, germanium, arsenic, selenium, indium, tin, bismuth, silver, gold, and additional antimony.

8. The structure of claim 1, wherein the phase change material is a chalcogenide alloy selected from the group consisting of germanium-antimony-tellurium, antimony-tellurium, antimony, and germanium-tellurium.

9. A structure comprising:
    a bottom electrode, the bottom electrode is cylindrical in shape;
    a phase change material layer on top of the bottom electrode;
    a liner separating the bottom electrode from the phase change material layer wherein the liner directly contacts the bottom electrode and the phase change material layer, and wherein the liner is configured to provide a current shunt path around an amorphous portion of the phase change material layer to a crystalline portion of the phase change material layer; and
    a barrier on top of the phase change material layer, wherein the barrier directly contacts and separates the phase change material layer from a top electrode, wherein the barrier is made of a phase change material that is doped with one or more dopants and differs from a material from which the liner is formed.

10. The structure of claim 9, wherein the bottom electrode comprises:
    an outer layer;
    a middle layer, wherein the middle layer is between the outer layer and an inner layer; and
    the inner layer, wherein the inner layer is surrounded by the middle layer.

11. The structure of claim 10, wherein the outer layer is less conductive than the middle layer.

12. The structure of claim 10, wherein the middle layer is more conductive than the inner layer.

13. The structure of claim 9, wherein the phase change material layer and the barrier have different thermal conductivities.

14. The structure of claim 9, wherein the phase change material is a mixture of a mixture of gallium, antimony, and at least one material selected from the group consisting of tellurium, silicon, germanium, arsenic, selenium, indium, tin, bismuth, silver, gold, and additional antimony.

15. A structure comprising:
    a bottom electrode, wherein the bottom electrode is on top and in direct contact with a top surface of a wire;
    a phase change material layer on top of the bottom electrode;
    a liner separating the bottom electrode from the phase change material layer, the liner directly contacts the bottom electrode and the phase change material layer, and wherein the liner is configured to provide a current shunt path around an amorphous portion of the phase change material layer to a crystalline portion of the phase change material layer; and a barrier on top of the phase change material layer, wherein the barrier directly contacts and separates the phase change material layer from a top electrode, wherein the barrier is made of a phase change material that is doped with one or more dopants and differs from a material from which the liner is formed, and wherein the barrier thermally insulates the top electrode from the phase change material layer.

16. The structure of claim 15, wherein the bottom electrode comprises:

an outer layer;

a middle layer, wherein the middle layer is between the outer layer and an inner layer; and the inner layer, wherein the inner layer is surrounded by the middle layer.

17. The structure of claim 16, wherein the outer layer is less conductive than the middle layer.

18. The structure of claim 16, wherein the middle layer is more conductive than the inner layer.

19. The structure of claim 15, wherein the phase change material layer and the barrier have different thermal conductivities.

20. The structure of claim 15, wherein the phase change material is a mixture of a mixture of gallium, antimony, and at least one material selected from the group consisting of tellurium, silicon, germanium, arsenic, selenium, indium, tin, bismuth, silver, gold, and additional antimony.

* * * * *